(12) United States Patent
Cheng et al.

(10) Patent No.: US 10,883,856 B2
(45) Date of Patent: Jan. 5, 2021

(54) MAGNET-TYPE SENSING MODULE

(71) Applicants: Chia-Pao Cheng, Hsinchu (TW); Pao-Lin Guo, Hsinchu (TW); An-Tsun Teng, Hsinchu (TW)

(72) Inventors: Chia-Pao Cheng, Hsinchu (TW); Pao-Lin Guo, Hsinchu (TW); An-Tsun Teng, Hsinchu (TW)

(73) Assignee: ZEALIO ELECTRONICS CO., LTD., Hsinchu (TW)

( * ) Notice: Subject to any disclaimer, the term of this patent is extended or adjusted under 35 U.S.C. 154(b) by 38 days.

(21) Appl. No.: 16/411,149

(22) Filed: May 14, 2019

(65) Prior Publication Data

US 2020/0363236 A1    Nov. 19, 2020

(51) Int. Cl.
*G01B 9/02* (2006.01)
*G01D 5/14* (2006.01)

(52) U.S. Cl.
CPC .................... *G01D 5/145* (2013.01)

(58) Field of Classification Search
CPC .. G01B 5/0011; G01B 9/02058; G01C 15/14; G01J 1/4228
See application file for complete search history.

(56) References Cited

U.S. PATENT DOCUMENTS

| | | | | |
|---|---|---|---|---|
| 2001/0040241 A1* | 11/2001 | Nagano | ................... | G01K 7/21 257/159 |
| 2004/0145355 A1* | 7/2004 | Taniguchi | ............... | H02P 9/006 322/29 |

\* cited by examiner

*Primary Examiner* — Tung X Nguyen
(74) *Attorney, Agent, or Firm* — Che-Yang Chen; Law Office of Michael Chen

(57) ABSTRACT

The present invention provides a magnet-type sensing module, comprising a control circuit and at least one signal generating component, wherein the control circuit is provided with a processing unit, a magnetic sensing unit and a magnetic element. An induced magnetic field of the magnetic sensing unit senses a magnetic change of the magnetic element to generate a first voltage change value or a second voltage change value to the processing unit, and the processing unit respectively generates an output activate voltage or an output turn-off voltage to the signal generating component to generate an output signal or turn off an output signal to solve the problems of inconvenient installation and accurate alignment of the installation location in the prior art, thereby achieving efficacies of convenient installation and effective induction of generating output signals.

14 Claims, 11 Drawing Sheets

MAGNET-TYPE SENSING MODULE

BACKGROUND OF THE INVENTION

Field of Invention

The present invention relates to an output signal generating module, and more particularly to a magnet-type sensing module which is convenient to install, and capable of effective induction of generating output signals and avoiding misjudgment.

Related Art

In modern society, cars have become widely used as tools for people to travel, and lighting devices are used in vehicles, in addition to being used as decorative effects, but also to provide daytime and nighttime warning and lighting effects, and thus many people will additionally install lighting devices such as warning lights and welcome pedals in the car. Especially in recent years, because the driver of the front car opened the door without noticing the rear approaching cars and pedestrians, resulting in a crash accident, which has became a major traffic accident. Especially when the light is dim at night, the lighting device at the door of the car is even more important. Some drivers in Taiwan will install reflective stickers or reflective anti-collision strips on an inner side of the car door, which are used to remind the rear pedestrians and cars, but the effects are poor. As a result, many manufacturers use the Hall sensor to introduce car warning lights and welcome pedals. However, technically the current Hall sensor needs to be driven by an external magnet to sense changes of the external magnetic field, but the disposition of the external magnet has the problem of alignment when being installed, and the magnetic field changes between the magnet and the sensor are explained as follows. For example: the judgment standard value of magnetic induction is greater than or less than 300, if the magnet is accurately mounted and moved directly above the sensor, the magnetic field signal received by the sensor is the maximum value, and the magnetic induction value is about 400. When the magnet is away, the magnetic induction value is about 50. But when the external magnet and the sensor are inaccurately aligned and when the magnet is close to the sensor, the magnet has a distance from the sensor, and the magnetic induction value is about 200. Therefore, when the magnet installation position is not accurate, it will affect the sensing function of the Hall sensor, and even cause the Hall sensor to fail or misjudge, and thus also cause the problem of inconvenient installation, and the magnet might also fall off because it is directly set. After the magnet is detached, an average user will be unable to position and install accurately, and it is troublesome to require the manufacturer to do the installation again.

Therefore, how to solve the above problems and drawbacks in the prior art is what the inventor of the present invention and relevant manufacturers engaged in this industry are eager to research and make improvement.

SUMMARY OF THE INVENTION

Therefore, in order to effectively solve the above problems, a main object of the present invention is to provide a magnet-type sensing module which is convenient to install, and capable of effective induction of generating output signals and avoiding misjudgment.

According to the object of the present invention, the present invention provides a magnet-type sensing module comprising a control circuit and at least one signal generating component, wherein the control circuit is provided with a processing unit, a magnetic sensing unit and a magnetic element. The processing unit is electrically connected to the magnetic sensing unit, and the magnetic sensing unit is adjacent to the magnetic element. An induced magnetic field of the magnetic sensing unit senses a magnetic change of the magnetic element to generate a first voltage change value, the first voltage change value is transmitted to the processing unit, and the processing unit receives the first voltage change value and generates an output activate voltage. Thereby the magnet-type sensing module can be directly disposed in a car door or a car pedal, and the magnetic element will have different magnetic changes due to opening and closing of the car door. The magnetic sensing unit senses a magnetic change of the magnetic element to generate the first voltage change value or a second voltage change value, the first voltage change value or the second voltage change value is received by the processing unit and respectively generates an output activate voltage or an output turn-off voltage. The signal generating component is electrically connected to the control circuit and receives the output activate voltage or the output turn-off voltage to generate an output signal or turn off an output signal, thereby achieving efficacies of convenient installation and effective induction of generating output signals.

According to an embodiment of the magnet-type sensing module of the present invention, wherein the magnetic sensing unit is a Hall switch or a magnetic sensor.

According to an embodiment of the magnet-type sensing module of the present invention, further comprising an accommodating component, the control circuit being disposed in the accommodating component, and a slot being formed in a bottom of the accommodating component, and the magnetic element being relatively disposed in the slot.

According to an embodiment of the magnet-type sensing module of the present invention, wherein a metal member is disposed on the bottom of the accommodating component, and the metal member is relatively disposed at a side of the magnetic element.

According to an embodiment of the magnet-type sensing module of the present invention, further comprising a power supply component, and the power supply component being electrically connected to the control circuit.

According to an embodiment of the magnet-type sensing module of the present invention, wherein the accommodating component is disposed adjacent to a position of a metal component, when the metal component is away from the magnetic element, the magnetic sensing unit senses a magnetic change of the magnetic element and generates the first voltage change value, and the processing unit receives the first voltage change value and generates the output activate voltage.

According to an embodiment of the magnet-type sensing module of the present invention, wherein the accommodating component is disposed adjacent to a position of a metal component, when the metal component is close to the magnetic element, the magnetic sensing unit senses a magnetic change of the magnetic element and generates the second voltage change value, and the processing unit receives the second voltage change value and generates the output turn-off voltage.

According to an embodiment of the magnet-type sensing module of the present invention, wherein the signal generating component is electrically connected to the control circuit and receives the output turn-off voltage to turn off an output signal.

According to an embodiment of the magnet-type sensing module of the present invention, further comprising a near-field sensing unit correspondingly disposed on the control circuit and electrically connected to the control circuit, and the near-field sensing unit being used to perform a near-field sensing procedure for sensing a near-field distance of the control circuit and the metal component to generate a near-field sensing signal.

According to an embodiment of the magnet-type sensing module of the present invention, wherein the control circuit further performs an interference procedure of noise mitigation to reduce noise in the near-field sensing signal.

According to an embodiment of the magnet-type sensing module of the present invention, wherein the control circuit further comprises an analog-to-digital converter, a median filter and a slope limiter. The median filter and the slope limiter are coupled to the analog-to-digital converter. The analog-to-digital converter is used for converting the near-field sensing signal into a digital near-field sensing signal, the median filter is used for performing a median filtering operation on the digital near-field sensing signal to filter out a surge noise in the digital near-field sensing signal, and the slope limiter is used for performing a slope limiting operation on the digital near-field sensing signal to filter out a drastic noise in the digital near-field sensing signal. The control circuit generates an operation signal according to results of the median filtering operation and the slope limiting operation, and the interference procedure of noise mitigation comprises the median filtering operation and the slope limiting operation.

According to an embodiment of the magnet-type sensing module of the present invention, wherein the control circuit further comprises a low-pass filter for performing a low-pass filtering operation on the operation signal to generate a low-pass filter signal.

According to an embodiment of the magnet-type sensing module of the present invention, wherein the low-pass filtering operation comprises a self-learning procedure, wherein the low-pass filter performs the self-learning procedure on the operation signal to achieve low-pass filtering of the operation signal to generate the low-pass filter signal.

DETAILED DESCRIPTION OF THE INVENTION

Figure 1:
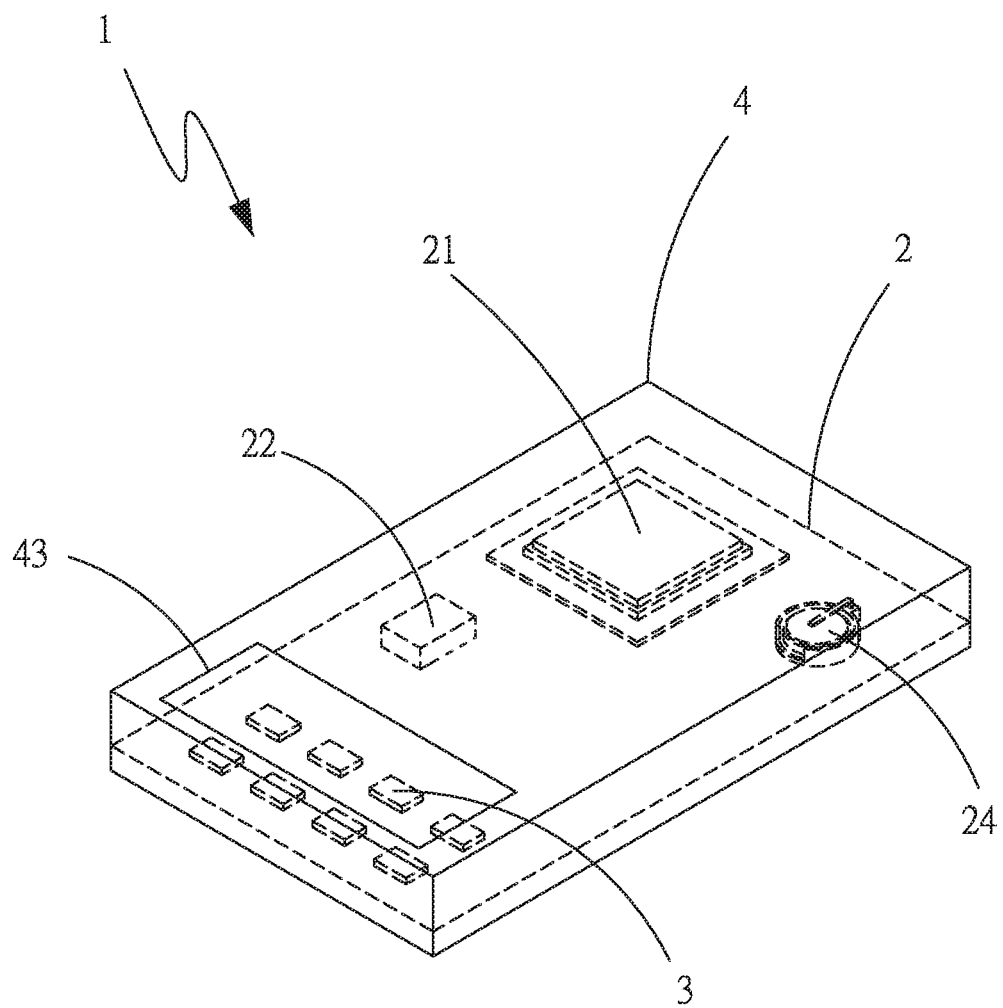
FIG. 1 is a schematic view of a magnet-type sensing module of the present invention.
Figure 2:
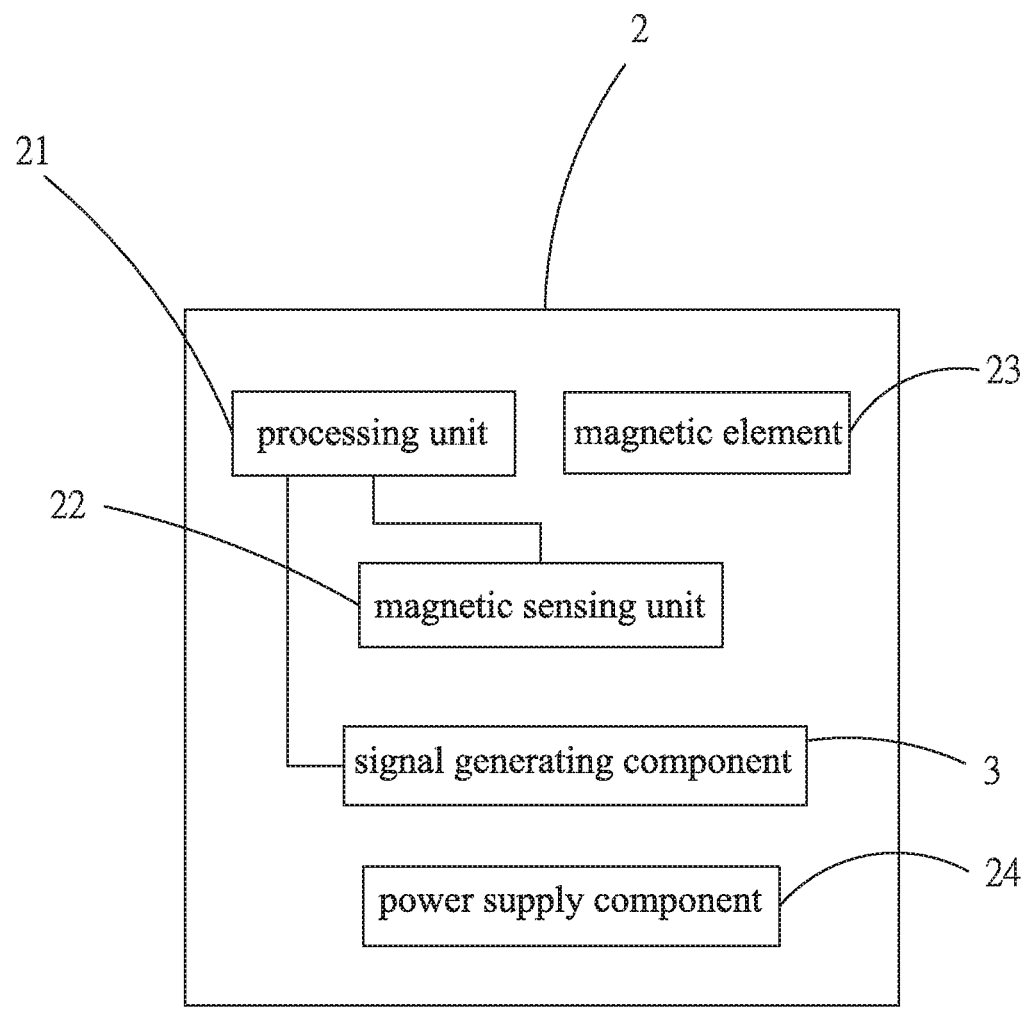
FIG. 2 is a block diagram of the magnet-type sensing module of the present invention.
Figure 3:
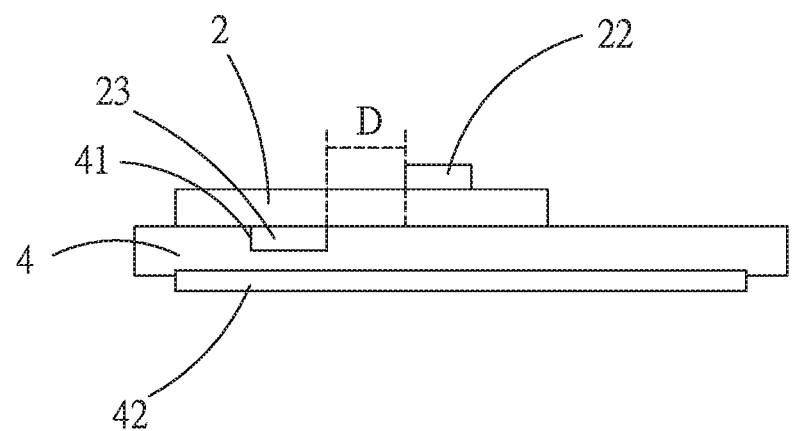
FIG. 3 is a side view of the magnet-type sensing module of the present invention.
Figure 4:
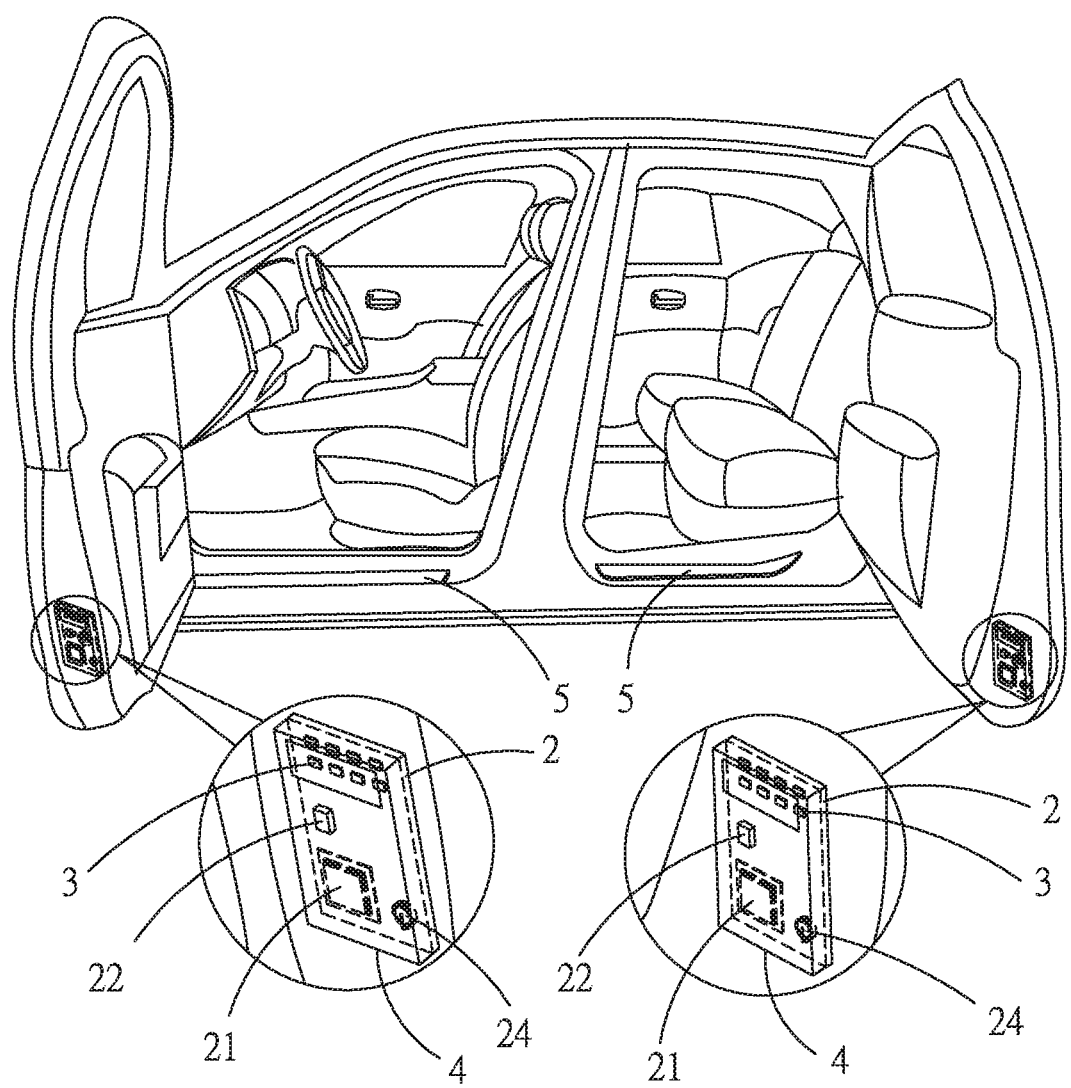
FIG. 4 is a first schematic view of the implementation of the magnet-type sensing module of the present invention.
Figure 5:
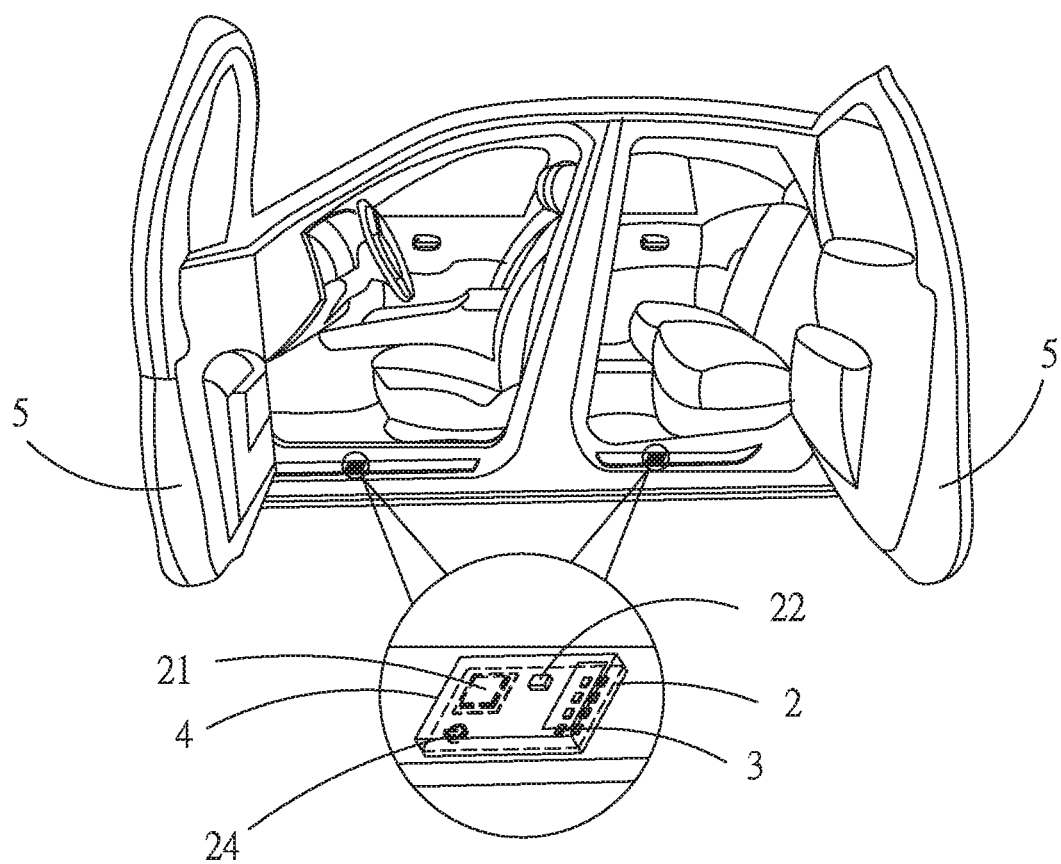
FIG. 5 is a second schematic view of the implementation of the magnet-type sensing module of the present invention.
Figure 6:
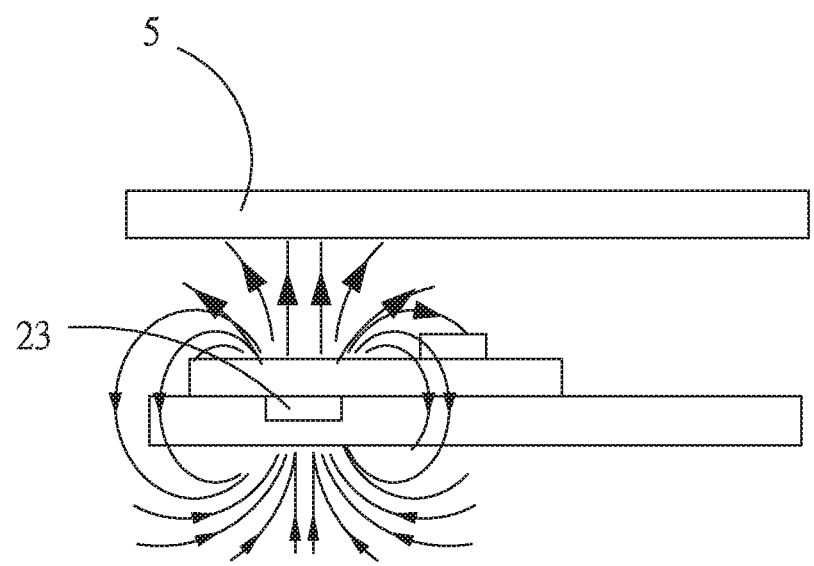
FIG. 6 is a first schematic view of the sensing of the magnet-type sensing module of the present invention.
Figure 7:
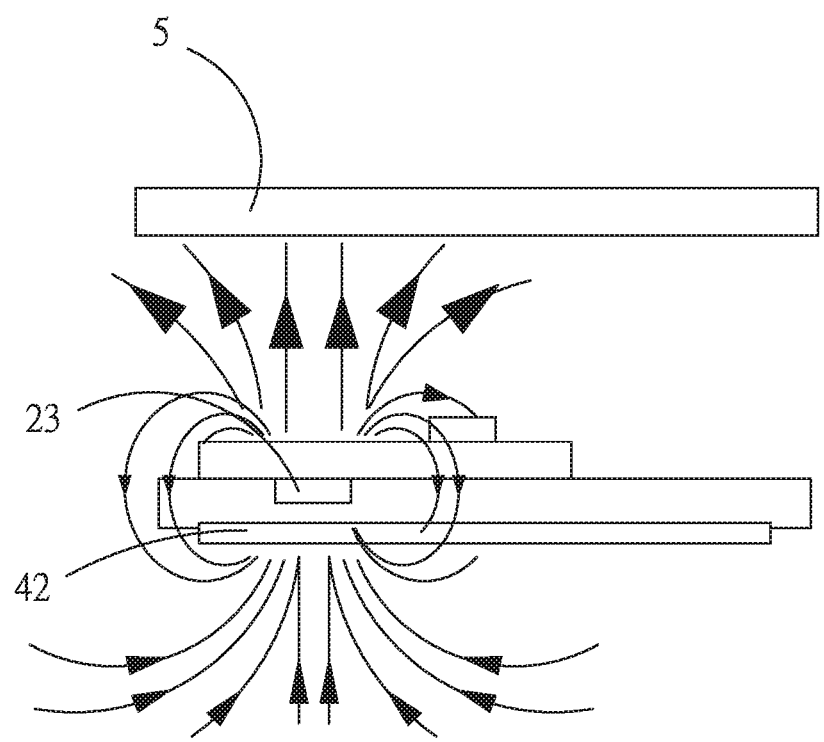
FIG. 7 is a second schematic view of the sensing of the magnet-type sensing module of the present invention.

Please refer to FIG. 1 and FIG. 2 and FIG. 3, which are respectively schematic view, block diagram and side view of a magnet-type sensing module of the present invention. It can be clearly seen from the figures that a magnet-type sensing module 1 comprises a control circuit 2, at least one signal generating component 3 and an accommodating component 4.

The control circuit 2 is provided with a processing unit 21, a magnetic sensing unit 22 and a magnetic element 23. The control circuit 2 is further provided with a power supply component 24, wherein the power supply component 24 supplies the control circuit 2 with an operating electric power, and the processing unit 21 is electrically connected to the magnetic sensing unit 22.

The signal generating component 3 is a component for generating an output signal or generating a sound source, such as a light emitting component or a speaker, and the signal generating component 3 is electrically connected to the control circuit 2, and the signal generating component 3 can be directly disposed on or externally connected to the control circuit 2. In this embodiment, the signal generating component 3 is directly disposed on the control circuit 2, the magnetic sensing unit 22 is a Hall switch, the processing unit 21 is a microprocessor, the magnetic sensing unit 22 is disposed above the control circuit 2, and the magnetic element 23 is disposed under the control circuit 2. The magnetic sensing unit 22 senses a magnetic change of the magnetic element 23, and the magnetic sensing unit 22 generates a first voltage change value or a second voltage change value according to the magnetic change. The magnetic sensing unit 22 transmits the first voltage change value and the second voltage change value to the processing unit 21, and the processing unit 21 receives the first voltage change value and converts the first voltage change value to generate an output activate voltage, and the processing unit 21 receives the second voltage change value and converts the second voltage change value to generate an output turn-off voltage. The processing unit 21 can transmit the output activate voltage to the signal generating component 3, and the signal generating component 3 generates an output signal via the output activate voltage. The processing unit 21 can transmit the output turn-off voltage to the signal generating component 3, and the signal generating component 3 turns off the output signal via the output turn-off voltage.

The control circuit 2 is disposed in the accommodating component 4, and a slot 41 is formed in a bottom of the accommodating component 4, and the magnetic element 23 is relatively disposed in the slot 41. A metal member 42 is disposed on the bottom of the accommodating component 4, and the metal member 42 can be an iron sheet and is relatively disposed at a side of the magnetic member 23.

Please refer to the foregoing drawings and FIG. 4 to FIG. 7, which are respectively first schematic view and second schematic view of the implementation of the magnet-type sensing module of the present invention, as well as first schematic view and second schematic view of the sensing of the magnet-type sensing module of the present invention.

Wherein the magnet-type sensing module 1 can be disposed in the accommodating component 4, on the accommodating component 4 is further formed with a light-transmitting portion 43, and the magnet-type sensing module 1 can be directly disposed or embedded on an automobile door via the accommodating component 4, and the magnet-type sensing module 1 is disposed adjacent to a position of a metal component 5. In this embodiment, the metal component 5 is an automobile pedal. When the automobile door is opened, the magnetic element 23 of the magnet-type sensing module 1 is away from the metal component 5, and the magnetic element 23 is not affected by the magnetism of the metal component 5. The magnetic sensing unit 22 senses a magnetic change of the magnetic element 23 to generate the first voltage change value, and the magnetic sensing unit 22 transmits the first voltage change value to the processing unit 21, the processing unit 21 converts the first voltage change value into the output activate voltage, and the processing unit 21 transmits the output activate voltage to the signal generating component 3. The signal generating component 3 generates an output signal via the output activate voltage, so that the output signal of the magnet-type sensing module 1 can be used as an alarm notification function. When the automobile door is closed, the magnetic element 23 of the magnet-type sensing module 1 is close to the metal component 5, and the magnetic element 23 is affected by the magnetism of the metal component 5. The magnetic sensing unit 22 senses a magnetic change of the magnetic element 23 to generate the second voltage change value, and the magnetic sensing unit 22 transmits the second voltage change value to the processing unit 21, the processing unit 21 converts the second voltage change value into the output turn-off voltage, and the processing unit 21 transmits the output turn-off voltage to the signal generating component 3. The signal generating component 3 turns off the output signal via the output turn-off voltage. Thereby the magnet-type sensing module 1 can be conveniently installed on the automobile door, and achieve efficacies of effective induction of generating output signals, or turning off output signals through the opening and closing of the automobile door.

Wherein the magnet-type sensing module 1 can be directly disposed or embedded on an automobile pedal via the accommodating component 4, and the magnet-type sensing module 1 is disposed adjacent to a position of the metal component 5. In this embodiment, the metal component 5 is an automobile door. When the automobile door is opened, the magnetic element 23 of the magnet-type sensing module 1 is away from the metal component 5, and the magnetic element 23 is not affected by the magnetism of the metal component 5. The magnetic sensing unit 22 senses a magnetic change of the magnetic element 23 to generate the first voltage change value, and the magnetic sensing unit 22 transmits the first voltage change value to the processing unit 21, the processing unit 21 converts the first voltage change value into the output activate voltage, and the processing unit 21 transmits the output activate voltage to the signal generating component 3. The signal generating component 3 generates an output signal via the output activate voltage, so that the output signal of the magnet-type sensing module 1 can be used as alarm notification and welcome pedal functions. When the automobile door is closed, the magnetic element 23 of the magnet-type sensing module 1 is close to the metal component 5, and the magnetic element 23 is affected by the magnetism of the metal component 5. The magnetic sensing unit 22 senses a magnetic change of the magnetic element 23 to generate the second voltage change value, and the magnetic sensing unit 22 transmits the second voltage change value to the processing unit 21, the processing unit 21 converts the second voltage change value into the output turn-off voltage, and the processing unit 21 transmits the output turn-off voltage to the signal generating component 3. The signal generating component 3 turns off the output signal via the output turn-off voltage. Thereby the magnet-type sensing module 1 can be conveniently installed on the automobile pedal, and achieve efficacies of effective induction of generating output signals, or turning off output signals through the opening and closing of the automobile door.

In addition, the magnetic sensing unit 22 is correspondingly disposed on the control circuit 2 and alternated with the magnetic element 23, so that a certain corresponding set distance D is between the magnetic sensing unit 22 disposed on the control circuit 2 and the magnetic element 23 disposed in the accommodating component 4, and the formula for distance calculation is as follows:

The distance D=0 mm+coefficient×(Gauss maximum value−the Gauss value of the magnetic element 23 used for assembly), and wherein the "coefficient" is derived from the test data between a plurality of the magnetic sensing units 22 and the magnetic element 23. Further explained, since the metal member 42 is affected by the magnetic member 23, the internal magnetic direction is relatively consistent, so that the metal member 42 is magnetized by the magnetic member 23, and the magnetized metal member 42 enhances the magnetic field around it, and thus the distance of sensing is greatly increased. Therefore, schematic views of the sensing of the magnet-type sensing module 1 without the metal member 42 or with the metal member 42 are provided for indication.

Figure 8:
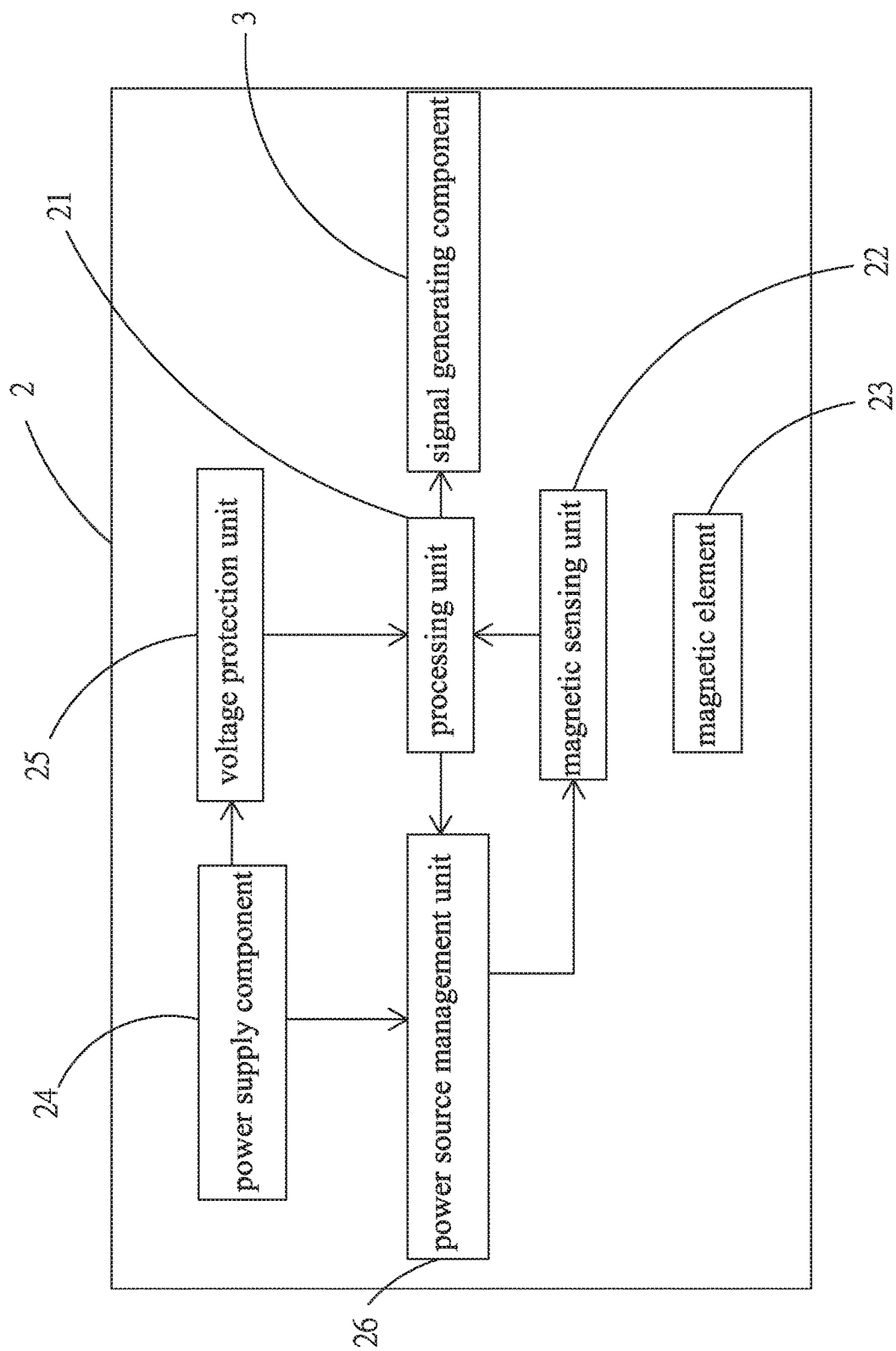
FIG. 8 is a block diagram of a second embodiment of the magnet-type sensing module of the present invention.

Please refer to FIG. 8 and FIG. 2 together. FIG. 8 is a block diagram of a second embodiment of the magnet-type sensing module of the present invention.

Corresponding relationships between the components of the magnet-type sensing module 1 are the same as those of the magnet-type sensing module 1 described above, so they will not be described here again. However, the main differences between the magnet-type sensing module 1 and the foregoing are that the control circuit 2 further has a voltage protection unit 25 electrically connected to the processing unit 21 and the power supply component 24. The voltage protection unit 25 is a short circuit prevention mechanism used to prevent the control circuit 2 from being damaged due to the reverse installation of the power supply component 24 or short circuit, thereby preventing damage of the control circuit 2 caused by short circuit. In addition, the control circuit 2 further has a power source management unit 26 electrically connected to the processing unit 21 and the power supply component 24. The control circuit 2 performs an on or off command to the magnetic sensing unit 22 through the power source management unit 26. In other words, if the magnetic sensing unit 22 is not in operation, it will automatically turn off to achieve a power saving mode.

In addition, the control circuit 2 of the present invention further has a near-field sensing unit 27 electrically connected to the processing unit 21. The near-field sensing unit 27 is used to perform a near-field sensing procedure to sense a near-field distance between the metal component 5 and the magnet-type sensing module 1 to generate a near-field sensing signal. Please refer to FIG. 9 as well, which is a block diagram of the magnet-type sensing module 1 of the present invention being used to perform an interference procedure of noise mitigation to reduce noise in the near-field sensing signal.

Figure 9:
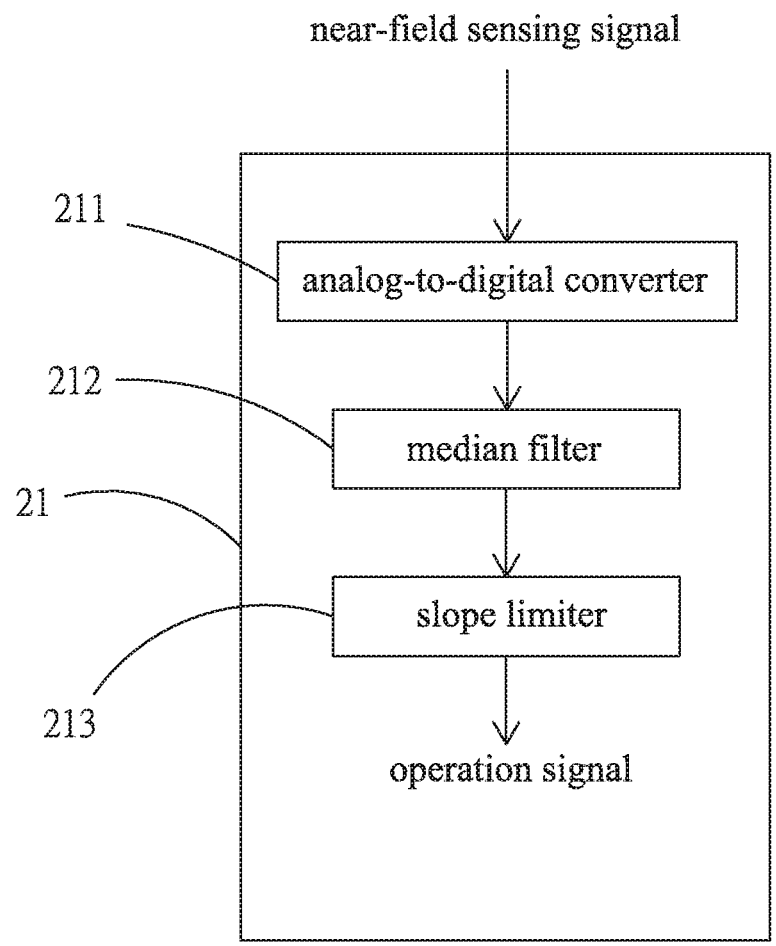
FIG. 9 is a block diagram of the magnet-type sensing module of the present invention being used to perform an interference procedure of noise mitigation.

In order to perform the interference procedure of noise mitigation by the control circuit 2 of the magnet-type sensing module 1, as shown in FIG. 9, the processing unit 21 further comprises an analog-to-digital converter 211, a median filter 212, and a slope limiter 213. The median filter 212 is coupled to the analog-to-digital converter 211. The analog-to-digital converter 211 is used for converting the near-field sensing signal into a digital near-field sensing signal. The median filter 212 is used for performing a median filtering operation on the digital near-field sensing signal to filter out a surge noise in the digital near-field sensing signal. The slope limiter 213 is coupled to the analog-to-digital converter 211, and is used for performing a slope limiting operation on the digital near-field sensing signal to filter out a drastic noise in the digital near-field sensing signal. Wherein the control circuit 2 generates an operation signal according to results of the median filtering operation and the slope limiting operation, and the interference procedure of noise mitigation comprises the median filtering operation and the slope limiting operation. The so-called median filtering operation refers to the median of the digital near-field sensing signal in each preset time interval; and the slope limiting operation refers to filtering out a portion of the slope beyond a predetermined slope in the signal waveform of the digital near-field sensing signal versus time. The median filtering operation and the slope limiting operation are well known to those of ordinary skill in the art, and will not be further described herein.

Figure 10:
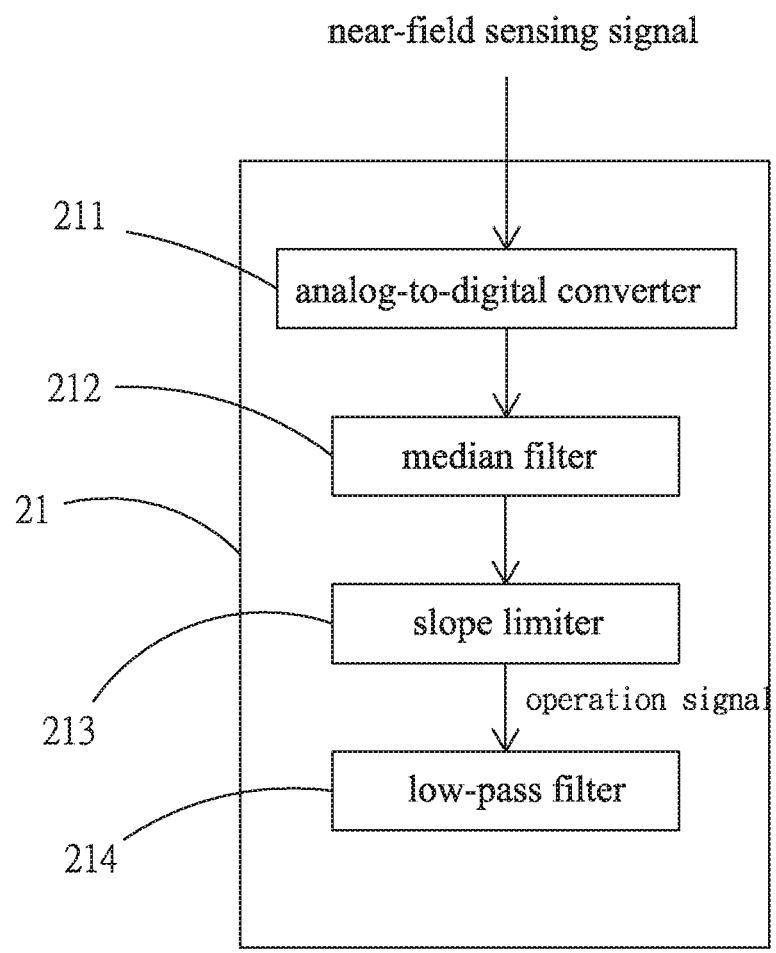
FIG. 10 is another block diagram of the magnet-type sensing module of the present invention being used to perform the interference procedure of noise mitigation.
Figure 11:
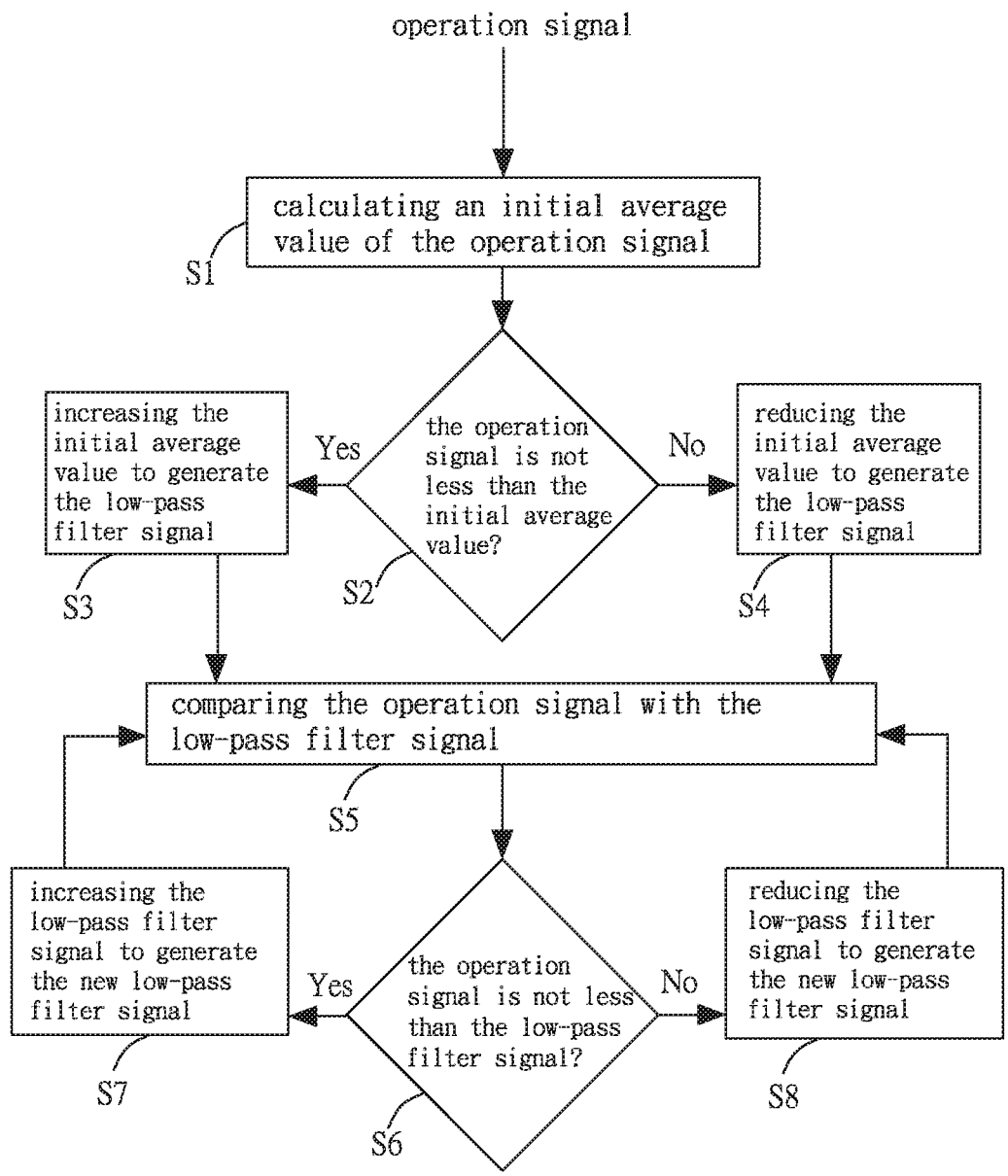
FIG. 11 is a block diagram of a self-learning procedure of the magnet-type sensing module of the present invention.

Continuing to refer to FIG. 10 and FIG. 11, in order to perform the interference procedure of noise mitigation by the magnet-type sensing module 1, the processing unit 21 further comprises a low-pass filter 214 for performing a low-pass filtering operation on the operation signal to generate a low-pass filter signal. The low-pass filtering operation has many modes of implementation. In one implementation mode, the low-pass filtering operation comprises a self-learning procedure, wherein the low-pass filter 214 performs the self-learning procedure on the operation signal to achieve low-pass filtering of the operation signal to generate the low-pass filter signal, wherein the self-learning procedure comprises the following steps:

S1: calculating an initial average value of the operation signal;

S2: comparing the operation signal with the initial average value;

S3: when the operation signal is not less than the initial average value, increasing the initial average value to generate the low-pass filter signal;

S4: when the operation signal is less than the initial average value, reducing the initial average value to generate the low-pass filter signal;

S5: comparing the operation signal with the low-pass filter signal; S6: checking the comparison result; S7: when the operation signal is not less than the low-pass filter signal, increasing the low-pass filter signal to generate the new low-pass filter signal;

S8: when the operation signal is less than the low-pass filter signal, reducing the low-pass filter signal to generate the new low-pass filter signal; and S9: repeating the step S5.

It is to be understood that the above description is only preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. A magnet-type sensing module, comprising:
a control circuit, the control circuit being provided with a processing unit, a magnetic sensing unit and a magnetic element, wherein the processing unit is electrically connected to the magnetic sensing unit, the magnetic sensing unit senses a magnetic change of the magnetic element to generate a first voltage change value or a second voltage change value, the processing unit receives the first voltage change value and generates an output activate voltage, and the processing unit receives the second voltage change value and generates an output turn-off voltage;
at least one signal generating component, the signal generating component being electrically connected to the control circuit and receiving the output activate voltage to generate an output signal; and
an accommodating component, the control circuit being disposed in the accommodating component, and a slot being formed in a bottom of the accommodating component, and the magnetic element being relatively disposed in the slot.

2. The magnet-type sensing module as claimed in claim 1, wherein the magnetic sensing unit is a Hall switch or a magnetic sensor.

3. The magnet-type sensing module as claimed in claim 1, wherein a metal member is disposed on the bottom of the accommodating component, and the metal member is relatively disposed at a side of the magnetic element.

4. The magnet-type sensing module as claimed in claim 1, further comprising a power supply component, and the power supply component being electrically connected to the control circuit.

5. The magnet-type sensing module as claimed in claim 1, wherein the accommodating component is disposed adjacent to a position of a metal component, when the metal component is away from the magnetic element, the magnetic sensing unit senses a magnetic change of the magnetic element and generates the first voltage change value, and the processing unit receives the first voltage change value and generates the output activate voltage.

6. The magnet-type sensing module as claimed in claim 1, wherein the accommodating component is disposed adjacent to a position of a metal component, when the metal component is close to the magnetic element, the magnetic sensing unit senses a magnetic change of the magnetic element and generates the second voltage change value, and the processing unit receives the second voltage change value and generates the output turn-off voltage.

7. The magnet-type sensing module as claimed in claim 6, wherein the signal generating component is electrically connected to the control circuit and receives the output turn-off voltage to turn off an output signal.

8. The magnet-type sensing module as claimed in claim 6, further comprising a near-field sensing unit correspondingly disposed on the control circuit and electrically connected to the control circuit, and the near-field sensing unit being used to perform a near-field sensing procedure for sensing a near-field distance of the control circuit and the metal component to generate a near-field sensing signal.

9. The magnet-type sensing module as claimed in claim 8, wherein the control circuit further performs an interference procedure of noise mitigation to reduce noise in the near-field sensing signal.

10. The magnet-type sensing module as claimed in claim 9, wherein the control circuit further comprises an analog-to-digital converter, a median filter and a slope limiter, the median filter and the slope limiter are coupled to the analog-to-digital converter, the analog-to-digital converter is used for converting the near-field sensing signal into a digital near-field sensing signal, the median filter is used for performing a median filtering operation on the digital near-field sensing signal to filter out a surge noise in the digital near-field sensing signal, and the slope limiter is used for performing a slope limiting operation on the digital near-field sensing signal to filter out a drastic noise in the digital near-field sensing signal, the control circuit generates an operation signal according to results of the median filtering operation and the slope limiting operation, and the interference procedure of noise mitigation comprises the median filtering operation and the slope limiting operation.

11. The magnet-type sensing module as claimed in claim 10, wherein the control circuit further comprises a low-pass filter for performing a low-pass filtering operation on the operation signal to generate a low-pass filter signal.

12. The magnet-type sensing module as claimed in claim 11, wherein the low-pass filtering operation comprises a self-learning procedure, wherein the low-pass filter performs the self-learning procedure on the operation signal to achieve low-pass filtering of the operation signal to generate the low-pass filter signal, wherein the self-learning procedure comprises the following steps of:

(A) calculating an initial average value of the operation signal;

(B) comparing the operation signal with the initial average value;

(C) when the operation signal is not less than the initial average value, increasing the initial average value to generate the low-pass filter signal;

(D) when the operation signal is less than the initial average value, reducing the initial average value to generate the low-pass filter signal;

(E) comparing the operation signal with the low-pass filter signal;

(F) when the operation signal is not less than the low-pass filter signal, increasing the low-pass filter signal to generate the new low-pass filter signal;

(G) when the operation signal is less than the low-pass filter signal, reducing the low-pass filter signal to generate the new low-pass filter signal; and (H) repeating the step (E).

13. The magnet-type sensing module as claimed in claim 1, wherein the control circuit further has a voltage protection unit electrically connected to the processing unit and the power supply component, and the voltage protection unit is used to prevent the control circuit from being damaged due to short circuit.

14. The magnet-type sensing module as claimed in claim 13, wherein the control circuit further has a power source management unit electrically connected to the processing unit and the power supply component, and the control circuit achieves a power saving mode for the magnetic sensing unit through the power source management unit.

* * * * *